US011793023B2

(12) United States Patent
Choi et al.

(10) Patent No.: US 11,793,023 B2
(45) **Date of Patent: *Oct. 17, 2023**

(54) DISPLAY APPARATUS HAVING PIXELS AROUND HOLE IN SUBSTRATE AND TOUCH LAYER OVERLAPPED WITH PASSIVATION LAYER

(71) Applicant: SAMSUNG DISPLAY CO., LTD., Yongin-si (KR)

(72) Inventors: Jonghyun Choi, Yongin-si (KR); Kinyeng Kang, Yongin-si (KR); Suyeon Sim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 262 days.

This patent is subject to a terminal disclaimer.

(21) Appl. No.: 17/180,622

(22) Filed: Feb. 19, 2021

(65) Prior Publication Data

US 2021/0202908 A1 Jul. 1, 2021

Related U.S. Application Data

(60) Continuation of application No. 16/894,621, filed on Jun. 5, 2020, now Pat. No. 10,978,674, which is a (Continued)

(30) Foreign Application Priority Data

Feb. 12, 2016 (KR) ........................ 10-2016-0016360

(51) Int. Cl.

*H10K 50/844* (2023.01)
*G04B 19/12* (2006.01)

(Continued)

(52) U.S. Cl.

CPC ........... *H10K 50/844* (2023.02); *G04B 19/04* (2013.01); *G04B 19/12* (2013.01); *H10K 59/40* (2023.02);

(Continued)

(58) Field of Classification Search

CPC . H01L 51/5253; H01L 51/56; H01L 51/5246; H01L 27/323; H01L 27/3244;

(Continued)

(56) References Cited

U.S. PATENT DOCUMENTS 4,488,818 A 12/1984 Saurer et al.
5,740,130 A * 4/1998 Grupp .................... G09F 23/16 368/242

(Continued)

FOREIGN PATENT DOCUMENTS

CN 1395323 A 2/2003
CN 101114668 A 1/2008

(Continued)

OTHER PUBLICATIONS

EPO Extended Search Report dated Jul. 11, 2017, for corresponding European Patent Application No. 16201523.4 (9 pages).

(Continued)

*Primary Examiner* — Lex H Malsawma
(74) *Attorney, Agent, or Firm* — Lewis Roca Rothgerber Christie LLP

(57) ABSTRACT

A method of manufacturing a display apparatus includes providing a substrate, forming a display unit defining an opening portion in a display region over the substrate, forming a thin film encapsulation layer to seal the display unit, forming a touch electrode over the thin film encapsulation layer, forming a touch insulating film covering the touch electrode such that the thin film encapsulation layer and the touch insulating film are sequentially stacked and (Continued)

4000

450 350 410
600
430
330
310b
310a
310
300
110
100
H
200
OP
DA formed over the substrate in the opening portion, forming a touch contact hole by removing a portion of the touch insulating film to expose a portion of the touch electrode, and removing a portion of the touch insulating film and a portion of the thin film encapsulation layer formed in the opening portion to expose a portion of the substrate during the forming of the touch contact hole.

14 Claims, 27 Drawing Sheets

Related U.S. Application Data continuation of application No. 16/572,462, filed on Sep. 16, 2019, now Pat. No. 10,680,205, which is a continuation of application No. 16/273,042, filed on Feb. 11, 2019, now Pat. No. 10,431,772, which is a division of application No. 15/298,082, filed on Oct. 19, 2016, now Pat. No. 10,230,069.

(51) Int. Cl.

*H10K 59/40* (2023.01)
*H10K 71/00* (2023.01)
*G04B 19/04* (2006.01)
*H10K 50/842* (2023.01)
*H10K 59/12* (2023.01)
*H10K 59/121* (2023.01)

(52) U.S. Cl.

CPC ......... *H10K 71/00* (2023.02); *H10K 50/8426* (2023.02); *H10K 59/12* (2023.02); *H10K 59/1201* (2023.02); *H10K 59/121* (2023.02)

(58) Field of Classification Search

CPC . H01L 27/326; H01L 2227/323; G04B 19/04; G04B 19/12; H10K 50/844; H10K 50/8426; H10K 59/40; H10K 59/1201; H10K 59/121; H10K 59/12; H10K 71/00

See application file for complete search history.

(56) References Cited

U.S. PATENT DOCUMENTS 6,556,222 B1 * 4/2003 Narayanaswami .. G04G 9/0064 368/69
7,067,976 B2 6/2006 Yamazaki
7,420,881 B2 * 9/2008 Frenkel ................. G06F 1/3228 345/169
7,630,122 B2 12/2009 Uchida
7,907,476 B2 * 3/2011 Lee ........................ G04G 21/08 345/173
8,415,675 B2 4/2013 Im et al.
8,552,643 B2 10/2013 Yoshinaga
8,638,030 B2 1/2014 Lee et al.
8,643,614 B2 2/2014 Wu et al.
8,772,824 B2 7/2014 Lee et al.
8,824,245 B2 * 9/2014 Lau ......................... G06F 1/163 368/69
9,252,388 B2 2/2016 Jang et al.
9,450,034 B2 9/2016 Lee et al.
9,582,124 B2 2/2017 Han
9,601,717 B2 3/2017 Lee et al.
9,696,838 B2 7/2017 Lee
9,753,590 B2 9/2017 Won et al.
9,785,123 B2 10/2017 Mansour et al.
10,001,686 B2 6/2018 Li et al.
10,026,897 B2 7/2018 Hanamura
10,032,835 B2 7/2018 Min et al.
10,230,069 B2 3/2019 Choi et al.
10,297,789 B2 5/2019 Jang et al.
10,431,772 B2 10/2019 Choi et al.
10,680,205 B2 * 6/2020 Choi .................. H01L 51/5253
10,978,674 B2 * 4/2021 Choi .................. H01L 51/5253
2004/0051451 A1 3/2004 Kawase et al.
2006/0033430 A1 2/2006 Peng
2006/0170649 A1 * 8/2006 Kosugi ................ H04N 5/2252 348/E5.026
2008/0117497 A1 5/2008 Shimodaira
2008/0151700 A1 * 6/2008 Inoue ..................... B60K 37/02 116/284
2009/0199130 A1 8/2009 Tsern et al.
2013/0021285 A1 1/2013 Kimura et al.
2013/0168215 A1 7/2013 Xie et al.
2014/0008668 A1 1/2014 Hirakata
2014/0133282 A1 5/2014 Hamm
2014/0319474 A1 10/2014 Kim et al.
2015/0034935 A1 2/2015 Choi
2015/0048329 A1 2/2015 Kim
2015/0144934 A1 5/2015 Rappoport et al.
2015/0303406 A1 10/2015 Kim
2015/0349041 A1 12/2015 Miyake
2017/0147116 A1 5/2017 Lee et al.
2017/0160841 A1 6/2017 Lou et al.

FOREIGN PATENT DOCUMENTS

CN 102097451 A 6/2011
CN 102117825 A 7/2011
CN 103824871 A 5/2014
CN 104332483 A 2/2015
CN 104517999 A 4/2015
CN 104934514 A 9/2015
CN 104979493 A 10/2015
CN 105161506 A 12/2015
EP 2731138 A1 5/2014
JP 2-177290 7/1990
JP 8-185984 7/1996
JP 2010-14475 A 1/2010
JP 2014-096355 A 5/2014
KR 10-2014-0062376 5/2014
KR 10-2014-0086708 A 7/2014
KR 10-2014-0118955 10/2014
KR 10-2014-0127633 A 11/2014
KR 10-2015-0012513 A 2/2015
KR 10-2015-0015771 2/2015
KR 10-2015-0016053 A 2/2015
KR 10-2015-0019380 A 2/2015
KR 10-2015-0122317 11/2015
KR 10-2015-0144258 12/2015
KR 10-2016-0000853 1/2016
TW I456443 B 10/2014

OTHER PUBLICATIONS

Chinese Office Action dated Feb. 26, 2021, issued in corresponding Chinese Patent Application No. 201710007490.1 (7 pages).

* cited by examiner

DISPLAY APPARATUS HAVING PIXELS AROUND HOLE IN SUBSTRATE AND TOUCH LAYER OVERLAPPED WITH PASSIVATION LAYER

CROSS-REFERENCE TO RELATED APPLICATIONS

This application is a continuation of U.S. patent application Ser. No. 16/894,621, filed on Jun. 5, 2020, which is a continuation of U.S. patent application Ser. No. 16/572,462, filed on Sep. 16, 2019, now U.S. Pat. No. 10,680,205, which is a continuation of U.S. patent application Ser. No. 16/273,042, filed on Feb. 11, 2019, now U.S. Pat. No. 10,431,772, which is a divisional of U.S. patent application Ser. No. 15/298,082, filed Oct. 19, 2016, now U.S. Pat. No. 10,230,069, which claims priority to and the benefit of Korean Patent Application No. 10-2016-0016360, filed Feb. 12, 2016, the entire contents of all of which are incorporated herein by reference.

BACKGROUND

1. Field

One or more embodiments relate to display apparatuses, and to methods of manufacturing the same.

2. Description of the Related Art

Recently, display apparatuses have been used for various purposes. Also, display apparatuses are widely used because they have become thin and lightweight. In particular, flat-panel display apparatuses have recently been extensively researched and manufactured. Because display apparatuses may be formed in the shape of a flat panel, the shapes of display apparatuses may be designed in various ways. Also, an increasing number of functions may be incorporated into, or associated with, the display apparatuses.

SUMMARY

One or more embodiments include display apparatuses having reduced occurrence of cracking and reduced propagation of cracks, and also include methods of manufacturing the same.

Additional aspects will be set forth in part in the description that follows and, in part, will be apparent from the description, or may be learned by practice of the presented embodiments.

According to one or more embodiments, a method of manufacturing a display apparatus includes providing a substrate, forming a display unit defining an opening portion in a display region over the substrate, forming a thin film encapsulation layer to seal the display unit, forming a touch electrode over the thin film encapsulation layer, forming a touch insulating film covering the touch electrode such that the thin film encapsulation layer and the touch insulating film are sequentially stacked and formed over the substrate in the opening portion, forming a touch contact hole by removing a portion of the touch insulating film to expose a portion of the touch electrode, and removing a portion of the touch insulating film and a portion of the thin film encapsulation layer formed in the opening portion to expose a portion of the substrate during the forming of the touch contact hole.

The method may further include forming a hole in the substrate by removing a portion of the exposed portion of the substrate.

The thin film encapsulation layer may include an organic film, and an inorganic film having a larger area than the organic film, and the touch insulating film and the inorganic film may contact each other at an edge of the organic film in the opening portion.

The method may further include removing a portion of the touch insulating film and the inorganic film contacting each other at the edge of the organic film in the opening portion during the forming of the touch contact hole.

The removed portion of the touch insulating film and the inorganic film in the opening portion may have a larger width than the hole.

The method may further include forming a touch line over the touch insulating film to contact the touch electrode through the touch contact hole.

The opening portion may have a larger width than the hole in the substrate.

The method may further include removing a portion of the touch insulating film and a portion of the thin film encapsulation layer formed in the opening portion during the forming of the touch contact hole, wherein the touch insulating film includes an inorganic material.

The thin film encapsulation layer may include at least one inorganic film and at least one organic film, and the method may further include removing a portion of the touch insulating film and a portion of the at least one inorganic film during the forming of the touch contact hole.

The removing the portion of the touch insulating film and the portion of the at least one inorganic film may include a dry etching process.

The touch insulating film may include an organic material, the thin film encapsulation layer may include an organic film, and an inorganic film having a larger area than the organic film, the touch insulating film and the inorganic film may be formed to contact each other at an edge of the organic film in the opening portion, and the touch insulating film and the inorganic film formed in the opening portion may be sequentially removed.

The touch insulating film may be removed by a photolithography process, and the inorganic film may be removed by a dry etching process.

The method may further include forming a barrier at an edge of the hole during the removing of the portion of the touch insulating film and the portion the thin film encapsulation layer formed in the opening portion.

The barrier may include a first layer including the thin film encapsulation layer, and a second layer including the touch insulating film.

The barrier may define a valley exposing a surface of the substrate.

The method may further include, before the forming of the hole in the substrate, forming a passivation layer in the opening portion to cover the barrier.

The method may further include, before the forming of the touch electrode, forming an upper dam over the thin film encapsulation layer.

The method may further include forming a buffer layer over the thin film encapsulation layer, wherein the upper dam is formed at an edge of the opening portion and prevents the buffer layer from spreading to the opening portion.

The touch electrode may be formed over the buffer layer.

The method may further include, before the forming of the thin film encapsulation layer, forming two lower dams spaced apart from each other over the substrate at an edge of the opening portion, wherein the thin film encapsulation layer is curved by the two lower dams to include one concave portion.

The concave portion may correspond to a position between the two lower dams, and the upper dam may be formed over the concave portion.

The two lower dams may surround the hole.

The display region may include a thin film transistor, and a display device connected electrically to the thin film transistor, and the display device may include an organic light-emitting device including a first electrode connected electrically to the thin film transistor, a second electrode facing the first electrode, and an intermediate layer interposed between the first electrode and the second electrode.

According to one or more embodiments, a display apparatus includes a substrate defining a hole, a display unit over the substrate, including a display region, and defining an opening portion in the display region, a thin film encapsulation layer for sealing the display unit, a touch electrode over the thin film encapsulation layer, a touch insulating film over the thin film encapsulation layer to cover the touch electrode, and defining a touch contact hole, and a barrier including a portion of the thin film encapsulation layer and a portion the touch insulating film sequentially stacked in the opening portion.

The thin film encapsulation layer may include at least one inorganic film and at least one organic film, and the barrier may include a first layer including the at least one inorganic film, and a second layer including the touch insulating film.

The barrier may define a valley exposing a surface of the substrate.

The display may further include a touch line over the touch insulating film and contacting the touch electrode through the touch contact hole.

The opening portion may have a larger width than the hole of the substrate.

The display may further include a passivation layer in the opening portion and covering the barrier.

The display may further include an upper dam and a buffer layer over the thin film encapsulation layer, wherein the upper dam is at an edge of the opening portion to prevent the buffer layer from spreading to the opening portion.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
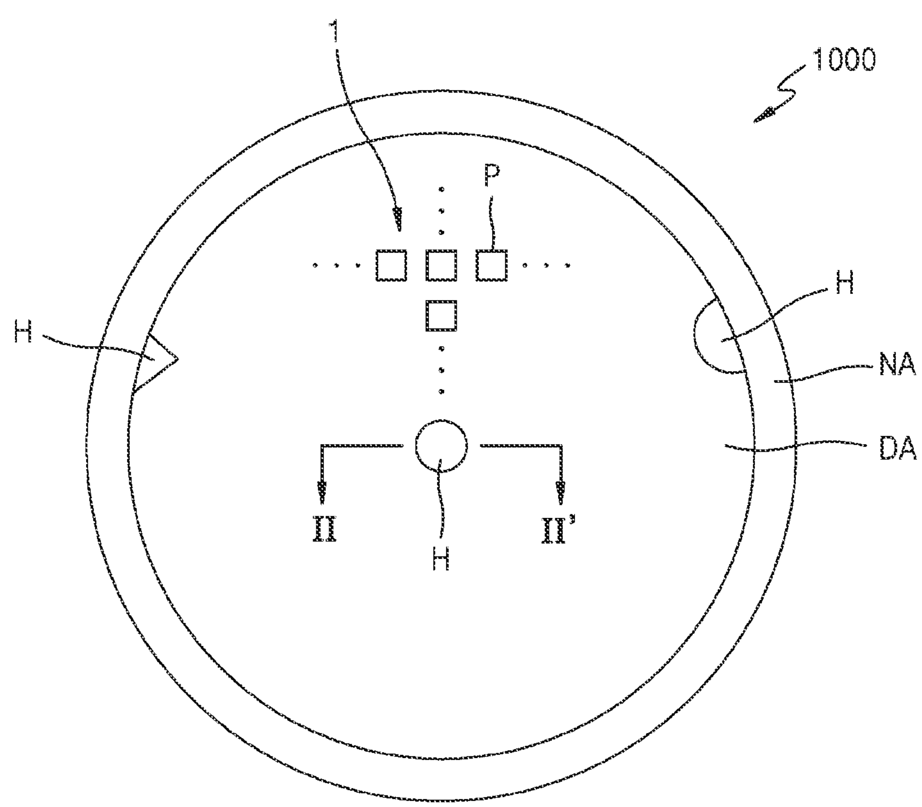
FIG. 1 is a schematic plan view of a display apparatus according to an embodiment.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display apparatus 1000 according to an embodiment.

Referring to FIG. 1, the display apparatus 1000 includes a display region/display area DA and a non-display region/non-display area NA. The display apparatus 1000 may include various devices, and may include, for example, an organic light-emitting device (OLED) or a liquid crystal display (LCD) device. Hereinafter, for convenience of description, it is assumed that the display apparatus 1000 includes an OLED.

The display region DA includes a hole H, and includes a pixel array 1 including pixels P surrounding the hole H. Each pixel P of the pixel array 1 includes a circuit unit, and an OLED connected electrically to the circuit unit, and provides an image by using the light emitted from the OLED.

The non-display region NA may surround the display region DA, and may include a driving unit, such as a data driving unit and a scan driving unit, for transferring a signal to each pixel P of the display region DA.

Although FIG. 1 illustrates that the hole H is at a center portion and is also at an edge portion(s) of the display region DA of the display apparatus 1000, the inventive concept is not limited thereto. The hole H may be located at any position in the display region DA while being surrounded by the pixels P. For example, the hole H may also be located at an outermost portion/an outer edge of the display region DA, as illustrated in FIG. 1.

Although FIG. 1 illustrates that the hole H has a circular shape, a semicircular shape, or a triangular shape, the inventive concept is not limited thereto. The display region DA may have various shapes, such as an elliptical shape and a tetragonal shape.

FIGS. 2A to 2E are sequential cross-sectional views taken along the line II-II' of FIG. 1 to illustrate a method of manufacturing a display apparatus according to an embodiment. FIG. 3 is a schematic partial cross-sectional view taken along the line II-II' of FIG. 1 to illustrate a display unit included in the display apparatus.

Hereinafter, a method of manufacturing a display apparatus according to an embodiment will be described in detail with reference to FIGS. 2A to 2E.

Figure 2A:
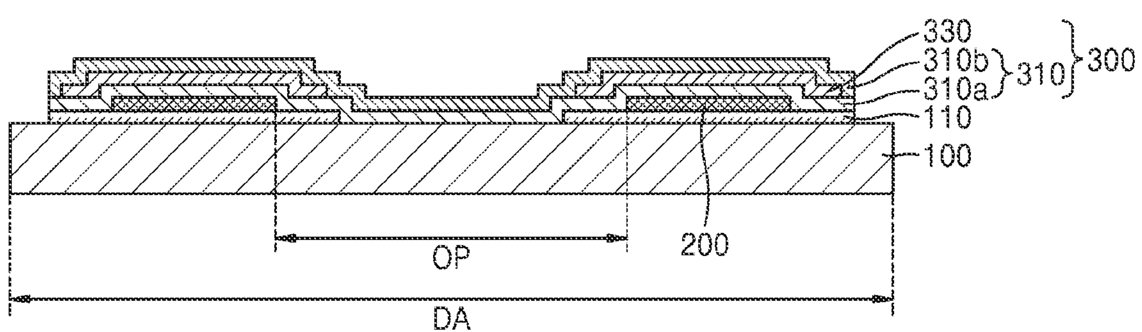
FIGS. 2A to 2E are sequential cross-sectional views taken along the line II-II' of FIG. 1 to illustrate a method of manufacturing a display apparatus according to an embodiment.
Figure 3:
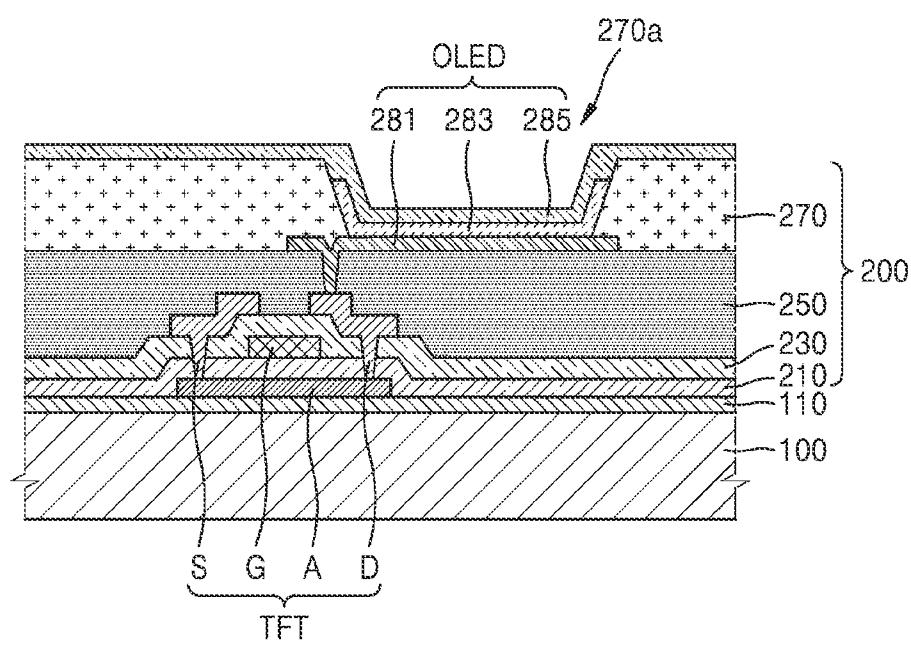
FIG. 3 is a schematic partial cross-sectional view taken along the line II-II' of FIG. 1 to illustrate a display unit included in the display apparatus.

First, FIG. 2A illustrates a substrate 100 located in the display region DA. A display unit 200 including/defining at least one opening portion OP may be formed in the display region DA of the substrate 100.

A buffer layer 110 may be first formed over the substrate 100, and then the display unit 200 may be formed over the buffer layer 110. Although FIG. 2A illustrates that the display unit 200 is formed over the buffer layer 110, the inventive concept is not limited thereto, and the display unit 200 may be formed directly over the substrate 100 in an alternative embodiment.

The substrate 100 may include various materials. The substrate 100 may be formed of a transparent glass material having $SiO_2$ as a main component. However, the substrate 100 is not limited thereto, and may also be formed of a transparent plastic material. The plastic material may be an organic material selected from the group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and/or cellulose acetate propionate (CAP), which are insulating organic materials.

Also, the substrate 100 may be formed of a flexible material to be two-dimensionally extended. As an alternative embodiment, the substrate 100 may be formed of a material having a Poisson's ratio of 0.4 or more. The Poisson's ratio refers to the ratio of a contraction strain, which is in a direction that is opposite to a direction of a stretching force, to an extension strain in a direction corresponding to the direction of the stretching force. When the substrate 100 is formed of a material having a Poisson's ratio of 0.4 or more (e.g., when the substrate 100 has an easily extensible property), the flexibility of the substrate 100 may be improved. Also, because the substrate 100 includes a flexible region, the shape of the display apparatus 1000 may be easily modified in a bending region.

The buffer layer 110 may function as a barrier layer and/or a blocking layer for reducing or preventing the diffusion of impurity ions into the display unit 200, reducing or preventing the infiltration of external air or moisture therethrough, and/or planarizing a surface of the substrate 100. For example, the buffer layer 110 may include inorganic materials, such as silicon oxide, silicon nitride, silicon oxynitride, aluminum oxide, aluminum nitride, titanium oxide, and/or titanium nitride, and/or may include organic materials, such as polyimide, polyester, and/or acryl, and may be formed of any stack thereof.

Hereinafter, the display unit 200 formed over the substrate 100 will be described in detail with reference to FIG. 3.

A thin film transistor TFT may be formed over the substrate 100. The thin film transistor TFT may include a semiconductor layer A, a gate electrode G, a source electrode S, and a drain electrode D. Although FIG. 3 illustrates a top gate type TFT sequentially including a semiconductor layer A, a gate electrode G, and a source electrode S and a drain electrode D, the inventive concept is not limited thereto and various types of TFTs, such as bottom gate type TFTs, may also be used herein.

The semiconductor layer A may be formed by using an organic semiconductor or an inorganic semiconductor, such as silicon. Also, the semiconductor layer A includes a source region, a drain region, and a channel region therebetween. For example, when the semiconductor layer A is formed by using amorphous silicon, the semiconductor layer A, which includes a source region, a drain region, and a channel region therebetween, may be formed by forming an amorphous silicon layer over the substrate 100, crystallizing the amorphous silicon layer to form a polycrystalline silicon layer, patterning the polycrystalline silicon layer, and then doping a drain region and a source region of an edge thereof.

After the forming of the semiconductor layer A, a gate insulating film 210 may be formed over the semiconductor layer A over the substrate 100. The gate insulating film 210 may include a single layer or multiple layers formed of an inorganic material, such as silicon oxide and/or silicon nitride. The gate insulating film 210 insulates the semiconductor layer A from the gate electrode G.

The gate electrode G may be formed above the gate insulating film 210. The gate electrode G is connected to a gate line for applying an on/off signal of the thin film transistor TFT. The gate electrode G may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and/or copper (Cu). However, the gate electrode G is not limited thereto, and may be formed of various materials in consideration of design conditions.

After the forming of the gate electrode G, an interlayer insulating film 230 may be formed over the substrate 100 to insulate the gate electrode G from the source electrode S and the drain electrode D. The interlayer insulating film 230 may be formed of an inorganic material. For example, the interlayer insulating film 230 may be formed of metal oxide and/or metal nitride, and the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zirconium oxide ($ZrO_2$). The interlayer insulating film 230 may include a single layer or multiple layers formed of an inorganic material, such as silicon oxide ($SiO_x$) and/or silicon nitride ($SiN_x$). In some embodiments, the interlayer insulating film 230 may include a dual structure of $SiO_x/SiN_y$ and/or $SiN_x/SiO_y$.

The source electrode S and the drain electrode D are formed over the interlayer insulating film 230. In an embodiment, the interlayer insulating film 230 and the gate insulating film 210 are formed to expose the source region and the drain region of the semiconductor layer A, and the source electrode S and the drain electrode D are formed to respectively contact the exposed source region and the exposed drain region of the semiconductor layer A. The source electrode S and the drain electrode D may include a single layer or multiple layers formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

The thin film transistor TFT is electrically connected to the OLED to apply a signal for driving the OLED to the OLED. The thin film transistor TFT may be covered and protected by a planarization film 250. The planarization film 250 may include an inorganic insulating film and/or an organic insulating film. For example, the inorganic insulating film may include $SiO_2$, $SiN_x$, SiON, $Al_2O_3$, $TiO_2$, $Ta_2O_5$, $HfO_2$, $ZrO_2$, BST, and/or PZT, and the organic insulating film may include a general-purpose polymer (PMMA, PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or any blend thereof. Also, the planarization film 250 may be formed of a composite stack of an inorganic insulating film and an organic insulating film.

The OLED may be provided over the planarization film 250. The OLED may include a first electrode 281, an intermediate layer 283 including an organic emission layer, and a second electrode 285. Holes and electrons injected from the first electrode 281 and the second electrode 285 of the OLED may be combined in the organic emission layer of the intermediate layer 283 to generate light.

The first electrode 281 is formed over the planarization film 250, and is electrically connected to the drain electrode D through a contact hole formed in/defined by the planarization film 250. However, the inventive concept is not limited to a case where the first electrode 281 is electrically connected to the drain electrode D, and the first electrode 281 may also be electrically connected to the source electrode S to receive an application of a signal for driving the OLED in other embodiments.

The first electrode 281 may be a reflective electrode, and may include a reflective film formed of Ag, Mg, Al, Pt, Pd, Au, Ni, Nd, Ir, Cr, and/or any compound thereof, and may also include a transparent or semitransparent electrode layer formed over the reflective film. The transparent or semitransparent electrode layer may include at least one selected from the group consisting of indium tin oxide (ITO), indium zinc oxide (IZO), zinc oxide (ZnO), indium oxide ($In_2O_3$), indium gallium oxide (IGO), and/or aluminum zinc oxide (AZO).

The intermediate layer 283 may include the organic emission layer. As an alternative example, the intermediate layer 283 may further include at least one of a hole injection layer (HIL), a hole transport layer (HTL), an electron transport layer (ETL), and an electron injection layer (EIL). However, the present embodiment is not limited thereto, and the intermediate layer 283 may include an organic emission layer and may further include other various functional layers.

The second electrode 285 is formed over the intermediate layer 283. The second electrode 285 may generate an electric field with the first electrode 281 to enable the intermediate layer 283 to emit light. The first electrode 281 may be patterned in each pixel, and the second electrode 285 may be formed to apply a common voltage to all pixels.

The second electrode 285, which is arranged to face the first electrode 281, may be a transparent or semitransparent electrode, and may be formed of a thin metal film having a low work function and including Li, Ca, LiF/Ca, LiF/Al, Al, Ag, Mg, and/or any compound thereof. Also, over the thin metal film, an auxiliary electrode layer or a bus electrode may be formed of a transparent electrode formation material such as ITO, IZO, ZnO, and/or $In_2O_3$. Accordingly, the second electrode 285 may transmit the light emitted from the organic emission layer included in the intermediate layer 283. For example, the light emitted from the organic emission layer may be emitted to the second electrode 285 directly, or may be emitted by being reflected by the first electrode 281 including a reflective electrode.

However, the display unit 200 of the present embodiment is not limited to a top/front emission type, but may also be a bottom/rear emission type in which the light emitted from the organic emission layer is emitted to the substrate 100. In this case, the first electrode 281 may include a transparent or semitransparent electrode, and the second electrode 285 may include a reflective electrode. Also, the display unit 200 of the present embodiment may be a dual-side emission type that emits the light in both directions corresponding to the top side and the bottom side.

As an alternative embodiment, the first electrode 281 may be patterned, for example, in each pixel. The display unit 200 may further include a pixel definition film/pixel defining film 270 formed over the first electrode 281 (e.g., over edges of the first electrode 281). The pixel definition film 270 may include/define an opening 270*a* that exposes the first electrode 281. The intermediate layer 283 may be electrically connected to the first electrode 281 by being formed corresponding to (e.g., in) the opening 270*a*. For example, by a spin coating process, the pixel definition film 270 may be formed of at least one organic insulating material selected from the group consisting of polyimide, polyamide, acrylic resin, benzocyclobutene, and/or phenolic resin.

Referring to FIG. 2A, a thin film encapsulation layer 300 sealing the display unit 200 may be formed over the display unit 200. The thin film encapsulation layer 300 may be formed to completely seal the display unit 200 to protect the display unit 200 from the external moisture or oxygen. As illustrated in FIG. 2A, the thin film encapsulation layer 300 may be formed to cover all of the display unit 200, including the opening portion OP, so that it may be stacked and formed over the substrate 100 while also being in the opening portion OP.

In an alternative embodiment, the thin film encapsulation layer 300 may have a structure in which a plurality of thin film layers are stacked (e.g., a structure in which an inorganic film 310 and an organic film 330 are alternately stacked).

The thin film encapsulation layer 300 may be formed by sequentially stacking a first inorganic film 310*a*, an organic film 330, and a second inorganic film 310*b* as illustrated in FIG. 2A. The number of thin film layers is not limited thereto, and a plurality of thin film layers may be alternately stacked and formed.

The inorganic film 310 may firmly block the infiltration of oxygen or moisture, and the organic film 330 may absorb a stress on the inorganic film 310 to give flexibility thereto. The inorganic film 310 may be a single film or may be a film stack including metal oxide and/or metal nitride. As an alternative embodiment, the inorganic film(s) may include any one of $SiN_x$, $Al_2O_3$, $SiO_2$, $TiO_2$, and/or SiON.

The organic film 330 may be formed of a polymer and may be, for example, a single film or a film stack formed of any one of polyethylene terephthalate, polyimide, polycarbonate, epoxy, polyethylene, and/or polyacrylate. For example, the organic film 330 may be formed of polyacrylate. In an embodiment, the organic film 330 may include a polymerized monomer composition including a diacrylate-based monomer and a triacrylate-based monomer. The monomer composition may further include a monoacrylate-based monomer. Also, the monomer composition may further include a photoinitiator such as trimethyl benzoyl diphenyl phosphine oxide (TPO), but the inventive concept is not limited thereto.

The first inorganic film 310*a* and the second inorganic film 310*b* may have a larger area than the organic film 330. For example, the organic film 330 may be completely sealed by the first inorganic film 310*a* and the second inorganic film 310*b*. The first inorganic film 310*a* and the second inorganic film 310*b* may contact each other at an edge of the organic film 330 in the opening portion OP as illustrated in FIG. 2A. For example, the first inorganic film 310*a* and the second inorganic film 310*b* may contact each other at an edge of, or at edges of, the organic film 330 to surround the organic film 330.

Figure 2B:
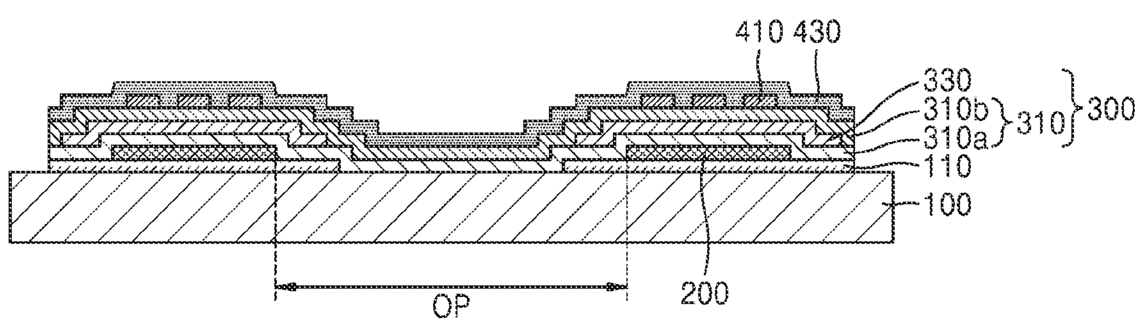

Next, referring to FIG. 2B, a touch electrode 410 may be formed over the thin film encapsulation layer 300, and a touch insulating film 430 may be formed to cover the touch electrode 410. The touch electrode 410 may be formed of a material that is electrically conductive without obstructing light transmission. For example, the touch electrode 410 may include metal oxide, such as indium tin oxide, indium zinc oxide, copper oxide, tin oxide, zinc oxide, and/or titanium oxide. Alternatively, the touch electrode 410 may include a nanowire, a photosensitive nanowire film, a carbon nanotube (CNT), a graphene, and/or a conductive polymer.

Alternatively, the touch electrode 410 may include various metals. For example, the touch electrode 410 may include at least one metal among chromium (Cr), nickel (Ni), copper (Cu), aluminum (Al), silver (Ag), molybdenum (Mo), gold (Au), titanium (Ti), and/or any alloy thereof, such as Ti/Al/Ti.

The touch insulating film 430 may be formed over the thin film encapsulation layer 300 to cover the touch electrode 410. The touch insulating film 430 may also be formed over the thin film encapsulation layer 300 in the opening portion OP, as illustrated in FIG. 2B. For example, the thin film encapsulation layer 300 and the touch insulating film 430 may be sequentially stacked and formed in the opening portion OP formed in the display unit 200. Because the first inorganic film 310*a* and the second inorganic film 310*b* of the thin film encapsulation layer 300 contact each other at an edge of the organic film 330 in the opening portion OP, the first inorganic film 310*a*, the second inorganic film 310*b*, and the touch insulating film 430 may be sequentially stacked in a region in the opening portion OP.

The touch insulating film 430 may be an inorganic film formed of an inorganic material, or may be an organic film formed of an organic material. As an alternative embodiment, the touch insulating film 430 may be a single film, or may be a film stack including metal oxide and/or metal nitride. For example, the touch insulating film 430 may include any one of $SiN_x$, $Al_2O_3$, $SiO_2$, and/or $TiO_2$.

As another alternative embodiment, the touch insulating film 430 may be formed of a polymer, and may be, for example, a single film or a film stack formed of any one of polyethylene terephthalate, polyimide, polycarbonate, epoxy, polyethylene, and/or polyacrylate. For example, the touch insulating film 430 may be formed of polyacrylate. In an embodiment, the touch insulating film 430 may include a polymerized monomer composition including a diacrylate-based monomer and/or a triacrylate-based monomer.

Figure 2C:
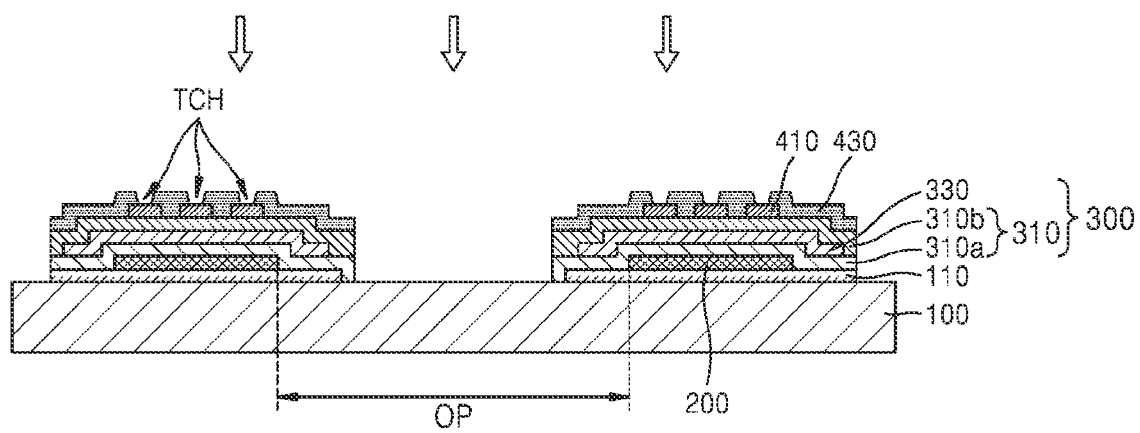

Next, referring to FIG. 2C, a touch contact hole(s) TCH may be formed by removing portions the touch insulating film 430 to expose at least a portion of the touch electrode 410.

In the display apparatus manufacturing method according to the present embodiment, at least a portion of the touch insulating film 430 and the thin film encapsulation layer 300 formed in the opening portion OP may be removed during the forming of the touch contact hole TCH. For example, as illustrated in FIG. 2C, a portion of the touch insulating film 430 and the thin film encapsulation layer 300 located in the opening portion OP may be removed to expose the substrate 100 during the process of forming the touch contact hole TCH.

Additionally, at least one inorganic film 310 of the thin film encapsulation layer 300 may be removed from the opening portion OP. Further, the first inorganic film 310*a*, the second inorganic film 310*b*, and the touch insulating film 430 stacked sequentially in the opening portion OP may be removed during the forming of the touch contact hole TCH.

When the touch insulating film 430 is formed of an inorganic material, the touch insulating film 430 and the thin film encapsulation layer 300 in the opening portion OP may be removed simultaneously (e.g., nearly simultaneously, or concurrently) while removing the touch insulating film 430 to form the touch contact hole TCH.

The thin film encapsulation layer 300 may include the first inorganic film 310*a*, the organic film 330, and the second inorganic film 310*b*, and the first inorganic film 310*a* and the second inorganic film 310*b* contact each other at an edge of the organic film 330 in the opening portion OP. Therefore, when the touch insulating film 430 is formed of an inorganic material, the inorganic film 310 and the touch insulating film 430 may be concurrently removed (removed in a single process) from the opening portion OP in the forming of the touch contact hole TCH.

According to an embodiment, the inorganic film 310 of the thin film encapsulation layer 300 and the touch insulating film 430 formed of an inorganic material may be concurrently removed by, for example, a dry etching process. Dry etching may effectively suppress vertical erosion that may otherwise occur with wet etching. Therefore, dry etching is suitable for fine pattern etching, and an etching process may be performed by a gas system, for example, by plasma without using a chemical solution. However, the process of removing the touch insulating film 430 and the inorganic film 310 of the thin film encapsulation layer 300 is not limited thereto, and the forming of the touch contact hole TCH and the removing of the touch insulating film 430 and the inorganic film 310 in the opening portion OP may be performed by any process for removing a film formed of an inorganic material.

In the display apparatus manufacturing method according to the present embodiment, at least a portion of the touch insulating film 430 and the inorganic film 310 stacked in the opening portion OP may be removed concurrently while performing the process of forming the touch contact hole TCH.

As another alternative embodiment, the touch insulating film 430 may be formed of an organic material. In this case, to form the touch contact hole TCH, the touch insulating film 430 may be removed by a photolithography process, and the inorganic film 310 may be removed by a dry etching process. For example, a photolithography process may be performed to remove a portion of the touch insulating film 430 over the touch electrode 410 and to remove a portion of the touch insulating film 430 in the opening portion OP, and a dry etching process may be performed to remove the inorganic film 310 in the opening portion OP. However, this process is merely an example, and the process of removing the touch insulating film 430 and the inorganic film 310 of the thin film encapsulation layer 300 is not limited thereto.

Figure 2D:
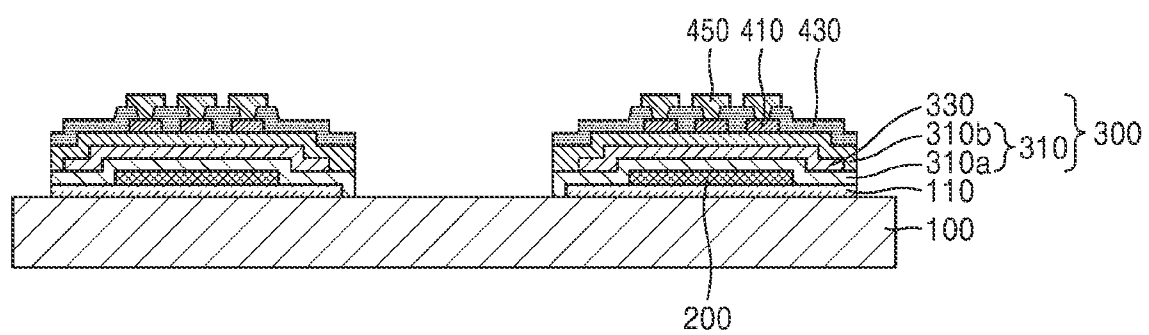

Next, referring to FIG. 2D, a touch line 450 may be formed over the touch insulating film 430. The touch line 450 may contact the touch electrode 410 through the touch contact hole TCH. The touch line 450 may include any line that is physically or electrically connected to the touch electrode 410. The touch line 450 may be formed of a low-resistance metal material, such as molybdenum (Mo), silver (Ag), titanium (Ti), copper (Cu), aluminum (Al), and/or Mo/Al/Mo.

Figure 2E:
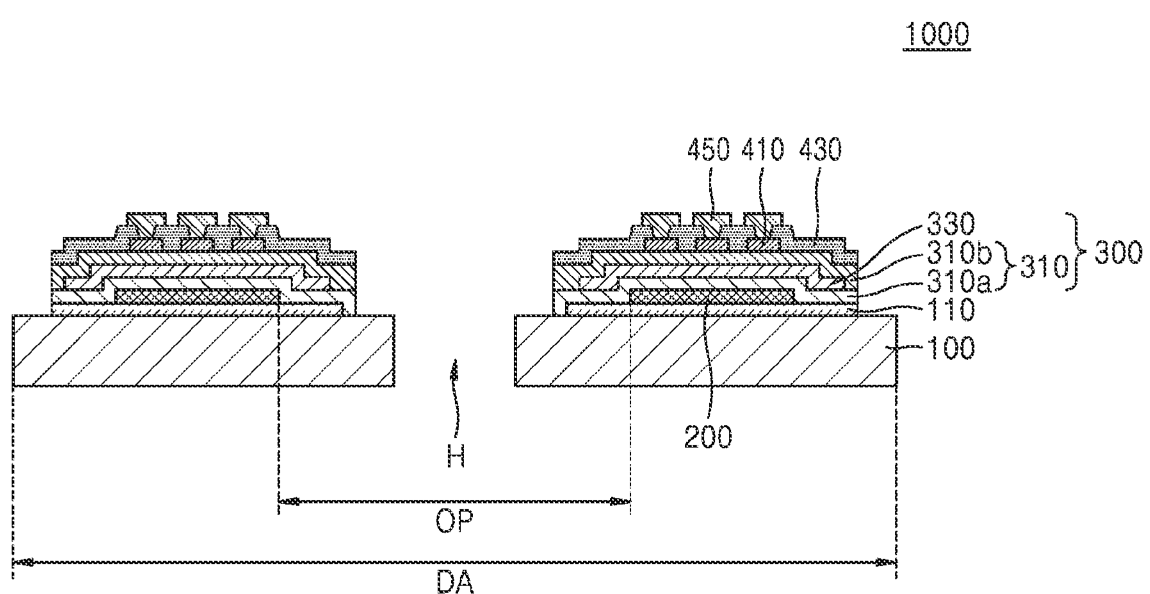

Next, referring to FIG. 2E, a hole H may be formed by removing at least a portion of the substrate 100 that is exposed by removing a portion of the touch insulating film 430 and a portion the thin film encapsulation layer 300 formed in the opening portion OP. That is, for example, the display apparatus 1000 having the hole H formed in the substrate 100 in the display region DA may be manufactured. The hole H may be formed by physically removing at least a portion of the substrate 100. The method of forming the hole H is not limited thereto, and the hole H may be formed by various methods.

Because the hole H is formed by removing at least a portion of the substrate 100 exposed by removing a portion of the touch insulating film 430 and a portion of the thin film encapsulation layer 300 formed in the opening portion OP, the hole H may have a smaller width than the opening portion OP. As an alternative embodiment, the hole H may have a smaller width than the width of the portion of touch insulating film 430 and the portion of the thin film encapsulation layer 300 removed in the opening portion OP.

A crack may occur when a portion of the substrate 100 is physically removed. Further, a crack may occur and propagate when an inorganic film is located over a portion where the substrate 100 is cut. In this case, the propagated crack may affect the display unit 200 to degrade the reliability of a display apparatus.

However, in the case of the display apparatus 1000 manufactured by the display apparatus manufacturing method according to the present embodiment, because the touch insulating film 430 and the inorganic film 310 in the opening portion OP are concurrently removed in advance of the process of forming the touch contact hole TCH, and because the hole H is formed by cutting a portion of the substrate 100 that is exposed by removing portions of the touch insulating film 430 and the inorganic film 310, the risk that a crack will occur and propagate in the inorganic film is reduced or eliminated. Thus, the display apparatus 1000 having the display unit 200 over the substrate 100 including the hole H may be manufactured without crack occurrence.

FIGS. 4A to 4D are sequential cross-sectional views illustrating a method of manufacturing a display apparatus according to another embodiment. In FIGS. 4A to 4D, reference numerals alike to those in FIGS. 1 to 3 will denote like elements. Thus, redundant descriptions thereof will be omitted hereafter for conciseness.

Figure 4A:
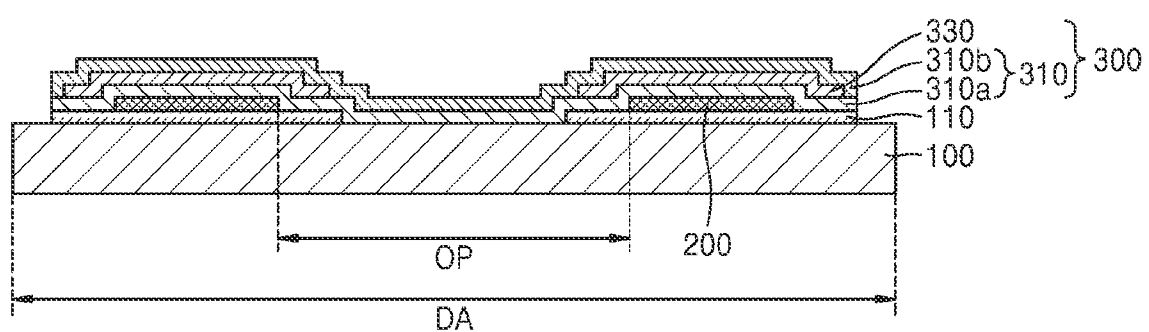
FIGS. 4A to 4D are sequential cross-sectional views illustrating a method of manufacturing a display apparatus according to another embodiment.

Referring to FIG. 4A, the display apparatus manufacturing method according to the present embodiment may prepare a substrate 100, may form a display unit 200 defining an opening portion OP over the substrate 100 of a display region DA, and may form a thin film encapsulation layer 300 for sealing the display unit 200.

The thin film encapsulation layer 300 may include at least one inorganic film 310 and at least one organic film 330. A first inorganic film 310*a*, an organic film 330, and a second inorganic film 310*b* may be alternately stacked and formed therein. The thin film encapsulation layer 300 may also be formed in the opening portion OP to completely protect the display unit 200 from the external moisture or oxygen. Further, the inorganic film 310 may have a larger area than the organic film 330. In this case, when the inorganic film 310 includes the first inorganic film 310*a* and the second inorganic film 310*b*, it may surround the organic film 330.

Figure 4B:
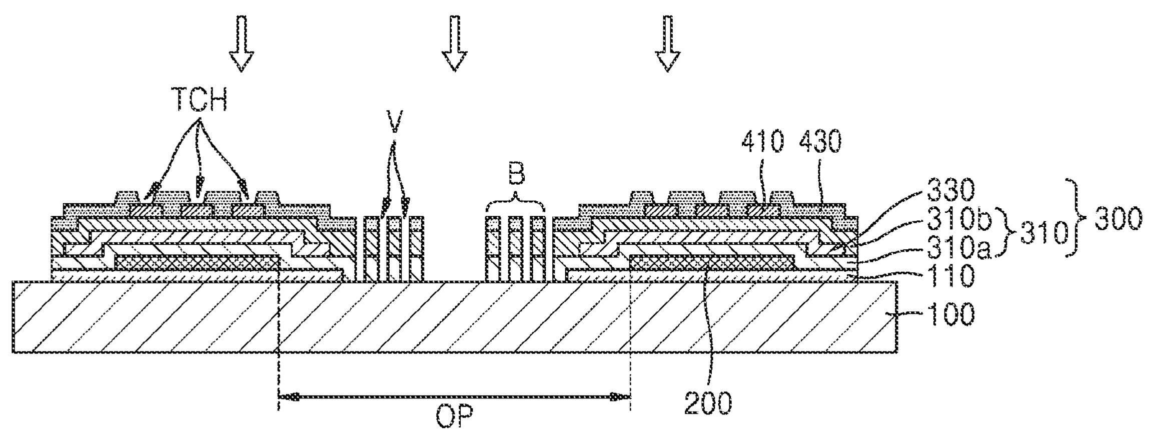

Next, referring to FIG. 4B, a touch electrode 410 may be formed over the thin film encapsulation layer 300, and a touch insulating film 430 may be formed over the thin film encapsulation layer 300 to cover the touch electrode 410.

The touch insulating film 430 may be an organic film formed of an organic material, or may be an inorganic film formed of an inorganic material. The touch insulating film 430 may be formed over the substrate 100, and may be stacked and formed in the opening portion OP. In one embodiment, the thin film encapsulation layer 300 and the touch insulating film 430 may be sequentially stacked and formed over the substrate 100 in the opening portion OP. In another embodiment, the touch insulating film 430 and the inorganic film 310 of the thin film encapsulation layer 300 may contact each other at an edge of the organic film 330 of the thin film encapsulation layer 300 in the opening portion OP.

Next, the touch insulating film 430 may be partially removed to expose at least a portion of the touch electrode 410. The touch insulating film 430 located over the touch electrode 410 may be partially removed to form a touch contact hole TCH.

The touch insulating film 430 and the thin film encapsulation layer 300 formed in the opening portion OP may be partially removed during the forming of the touch contact hole TCH.

As an alternative embodiment, the inorganic film 310 and the touch insulating film 430 may be sequentially stacked and formed to contact each other at an edge of the organic film 330 in the opening portion OP, and the touch insulating film 430 and the inorganic film 310 in the opening portion OP may be partially removed during the forming of the touch contact hole TCH.

When the touch insulating film 430 is an inorganic film formed of an inorganic material, a portion of the touch insulating film 430 and the inorganic film 310 in the opening portion OP may be removed concurrently with the removal of a portion of the touch insulating film 430 to form the touch contact hole TCH.

The inorganic film 310 and the touch insulating film 430 may be removed, for example, by a dry etching process.

The touch insulating film 430 and the thin film encapsulation layer 300 in the opening portion OP may be partially removed to form a barrier B. The barrier B may include a first layer formed of the thin film encapsulation layer 300 (e.g., the inorganic film 310), and a second layer formed of the touch insulating film 430.

As an alternative embodiment, the first inorganic film 310*a* and the second inorganic film 310*b* may be stacked to form the thin film encapsulation layer 300 in the opening portion OP, and in this case, the first layer of the barrier B may include the first inorganic film 310*a* and the second inorganic film 310*b*.

At least one valley V exposing a surface of the substrate 100 may be formed by partially removing the touch insulating film 430 and the thin film encapsulation layer 300 in the barrier B during the forming of the barrier B.

As illustrated in FIG. 4B, two valleys V may be formed in the barrier B. Accordingly, two portions exposing the substrate 100 may be formed in the barrier B, and thus, the barrier B may be formed to be split into three pillars.

The display apparatus manufacturing method according to the present embodiment may reduce or prevent the propagation of a crack by partially removing the touch insulating film 430 and the thin film encapsulation layer 300 formed of an inorganic material to expose the substrate 100.

Also, time and cost may be saved because the barrier B and the valley V may be formed in the opening portion OP concurrently with the forming of the touch contact hole TCH without an additional process.

Figure 4C:
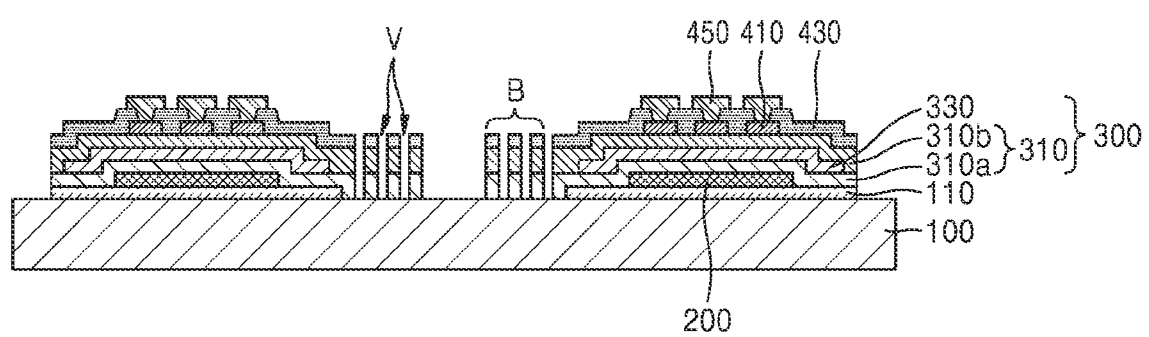

Next, referring to FIG. 4C, a touch line 450 may be formed in/over the touch contact hole TCH. The touch line 450 may contact the touch electrode 410 through the touch contact hole TCH, and the touch line 450 may include any line that is physically or electrically connected to the touch electrode 410.

Figure 4D:
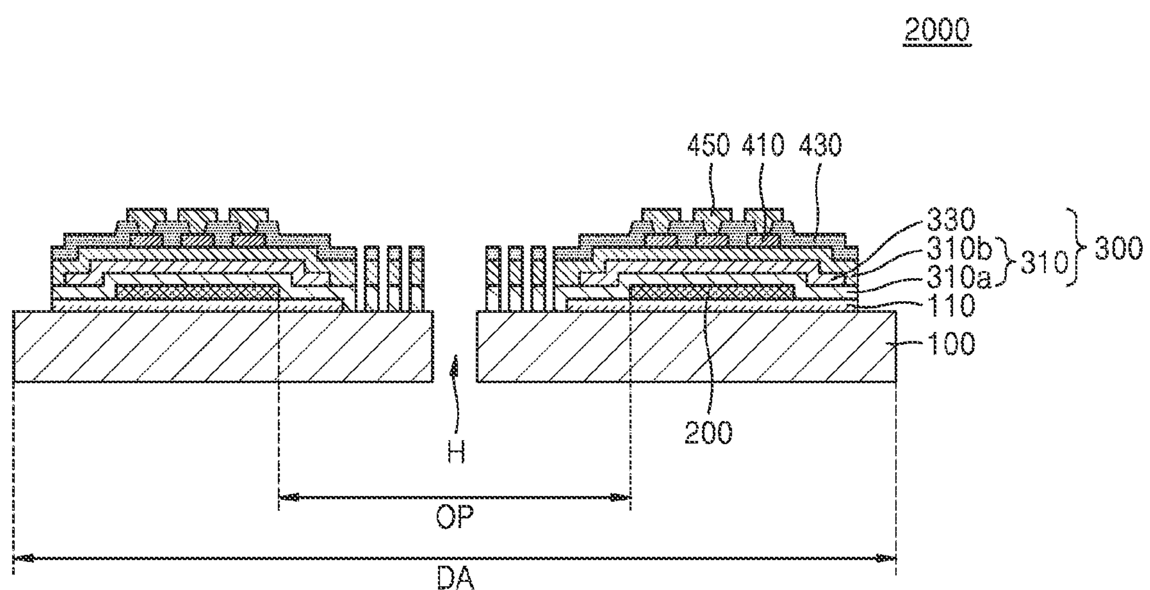

Next, referring to FIG. 4D, a hole H may be formed by removing at least a portion of the substrate 100 that is exposed by removing a portion of the touch insulating film 430 and the thin film encapsulation layer 300 in the opening portion OP.

In a display apparatus 2000 manufactured by the display apparatus manufacturing method according to the present embodiment, the hole H may be formed in the substrate 100 in the display region DA, and the barrier B formed of the thin film encapsulation layer 300 and the touch insulating film 430 may be arranged at or around an edge of the hole H.

The hole H may be formed by physically removing at least a portion of the substrate 100. The method of forming the hole H is not limited thereto, and the hole H may be formed by various methods. The hole H may have a smaller width than the opening portion OP.

When the hole H is physically formed in the substrate 100, a crack may occur due to an impact thereof. In this case, the crack may propagate through the inorganic film arranged over the substrate 100, to affect the reliability of a display apparatus.

However, in the case of the display apparatus 2000 manufactured by the display apparatus manufacturing method according to the present embodiment, because the inorganic films arranged at a portion for formation of the hole H are removed in advance before the forming of the hole H in the substrate 100, the occurrence and propagation of a crack may be reduced or prevented. Also, the touch insulating film 430 and the thin film encapsulation layer 300 in the opening portion OP may be concurrently removed in the process of forming the touch contact hole(s) TCH.

Also, because the barrier B is formed by partially removing the touch insulating film 430 and the thin film encapsulation layer 300 that are arranged at an edge of the portion for formation of the hole H before the forming of the hole H, even if a crack occurs, the propagation of the crack may be reduced or prevented.

Figure 5A:
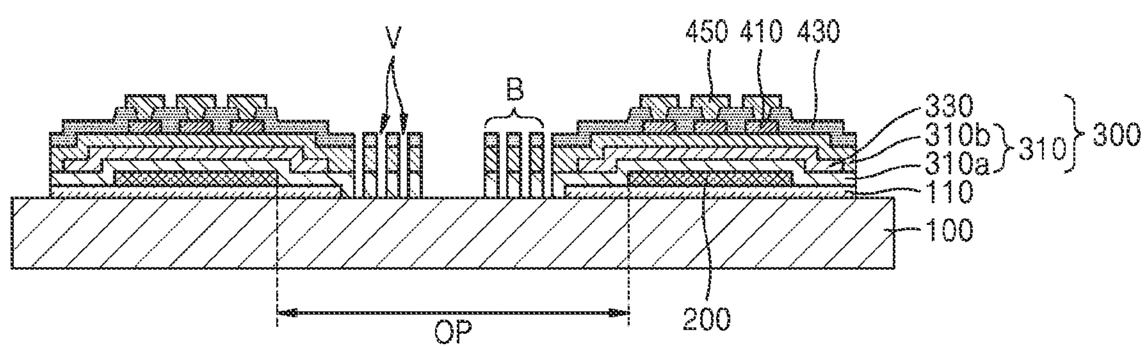
FIGS. 5A to 5C are sequential cross-sectional views illustrating a method of manufacturing a display apparatus according to another embodiment.
Figure 5B:
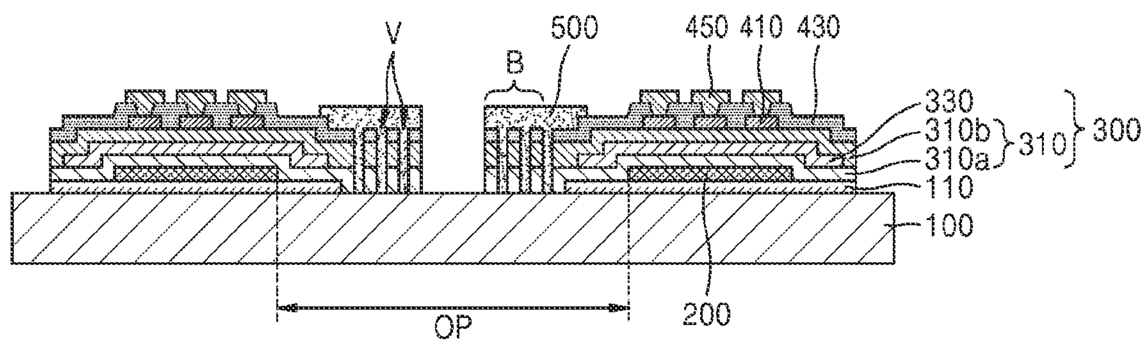
Figure 5C:
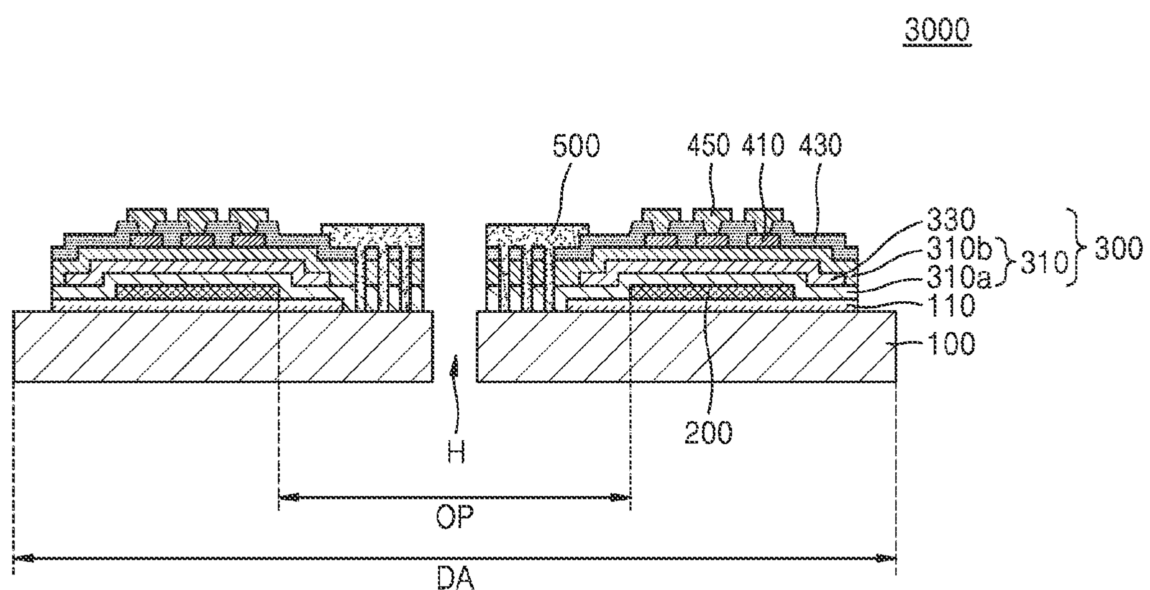

FIGS. 5A to 5C are sequential cross-sectional views illustrating a method of manufacturing a display apparatus according to another embodiment. Herein, for conciseness, differences from the display apparatus manufacturing method illustrated in FIGS. 4A to 4D will be mainly described, and like reference numerals will denote like elements, and thus redundant descriptions thereof will be omitted.

First, referring to FIG. 5A, a display unit 200 including an opening portion OP, a thin film encapsulation layer 300, a touch electrode 410, and a touch insulating film 430 may be sequentially formed over a substrate 100.

Thereafter, when a touch contact hole(s) TCH is formed, the touch insulating film 430 and the thin film encapsulation layer 300 in the opening portion OP may be partially removed to form a barrier B. As an alternative embodiment, a valley V partially exposing the substrate 100 may be additionally formed in the barrier B.

Thereafter, a touch line 450 may be formed in/over the touch contact hole(s) TCH. The touch line 450 may contact the touch electrode(s) 410 through the touch contact hole(s) TCH.

Next, referring to FIG. 5B, a passivation layer 500 may be formed to cover the barrier B.

In an embodiment, the passivation layer 500 may be formed of an organic material. The passivation layer 500 may be formed of a polymer and may be, for example, a single film or a film stack formed of any one of polyethylene terephthalate, polyimide, polycarbonate, epoxy, polyethylene, and polyacrylate. For example, the organic films may be formed of polyacrylate. In an embodiment, the organic films may include a polymerized monomer composition including a diacrylate-based monomer and a triacrylate-based monomer.

As an alternative embodiment, the passivation layer 500 may be formed by, for example, an organic process or a printing (ink-jet) process.

The passivation layer 500 may be formed in the opening portion OP to cover the barrier B. For example, as illustrated in FIG. 5B, the passivation layer 500 may be formed over the substrate 100 at the formation position of the barrier B in the opening portion OP.

The passivation layer 500 may be formed in a region where the touch insulating film 430 and the thin film encapsulation layer 300 are partially removed, to cover the barrier B.

As an alternative embodiment, when a valley V partially exposing the substrate 100 is formed in the barrier B, the passivation layer 500 may be formed also in the valley V (e.g., to touch the substrate 100).

Because an organic film may absorb a stress on an inorganic film to give flexibility thereto, the occurrence of a crack may be reduced or prevented when the passivation layer 500 formed of an organic material is formed in the valley V and over the barrier B to cover the barrier B formed of an inorganic material.

Next, referring to FIG. 5C, a hole H may be formed by removing at least a portion of the substrate 100 that is exposed by removing a portion of the touch insulating film 430 and the thin film encapsulation layer 300 in the opening portion OP.

In a display apparatus 3000 manufactured by the display apparatus manufacturing method according to the present embodiment, the hole H may be formed in the substrate 100 in the display region DA, and the barrier B formed of the thin film encapsulation layer 300 and the touch insulating film 430 may be arranged at or around an edge of the hole H. Also, the passivation layer 500 may be formed in the opening portion OP to cover the barrier B.

The hole H may be formed by physically removing at least a portion of the substrate 100. The method of forming the hole H is not limited thereto, and the hole H may be formed by various methods.

As an alternative embodiment, the hole H may have a smaller width than the opening portion OP.

In the case of the display apparatus 3000 manufactured by the display apparatus manufacturing method according to the present embodiment, because the inorganic films arranged at a portion for formation of the hole H are removed in advance before the forming of the hole H in the substrate 100, the occurrence and propagation of a crack may be reduced or prevented. Also, time and cost may be saved because the touch insulating film 430 and the thin film encapsulation layer 300 in the opening portion OP may be concurrently removed in the process of the forming the touch contact hole(s) TCH.

Also, because the barrier B is formed by partially removing the touch insulating film 430 and the thin film encapsulation layer 300 arranged at/around an edge of the portion to be removed for formation of the hole H before the forming of the hole H, even when a crack occurs, the propagation of the crack may be reduced or prevented.

In addition, because the passivation layer 500 covering the barrier B may be formed, and because the passivation layer 500 may be formed of an organic film absorbing a stress to give flexibility, the occurrence of a crack may be efficiently reduced or prevented.

FIGS. 6A to 6F are sequential cross-sectional views illustrating a method of manufacturing a display apparatus according to another embodiment. In FIGS. 6A to 6F, like reference numerals as those in FIGS. 1 to 3 will denote like elements. Thus, herein, redundant descriptions thereof will be omitted for conciseness.

Figure 6A:
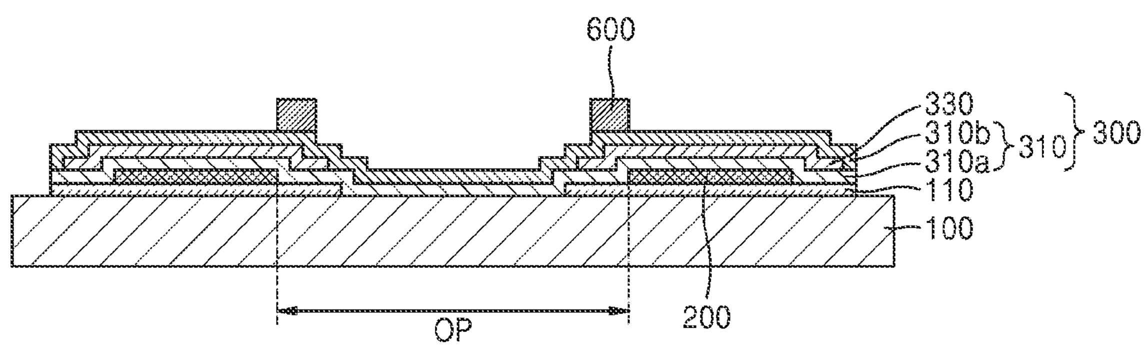
FIGS. 6A to 6F are sequential cross-sectional views illustrating a method of manufacturing a display apparatus according to another embodiment.

First, referring to FIG. 6A, a display unit 200 including an opening portion OP may be formed over a substrate 100, and a thin film encapsulation layer 300 may be formed to seal the display unit 200.

Next, an upper dam 600 may be formed over the thin film encapsulation layer 300.

As an alternative embodiment, the upper dam 600 may be formed at a position corresponding to an edge of the opening portion OP. For example, the upper dam 600 may be formed to surround the opening portion OP.

The number of upper dams 600 is not limited, and the upper dam 600 may be formed to have a certain height to function as a dam as described later.

FIG. 6A illustrates that the upper dam 600 is formed at a position corresponding to an edge of the opening portion OP (e.g., to be at least partially within the opening portion OP). However, the formation position of the upper dam 600 is not limited thereto, and the upper dam 600 may be formed at any position over the thin film encapsulation layer 300 as long as it functions as a dam.

Figure 6B:
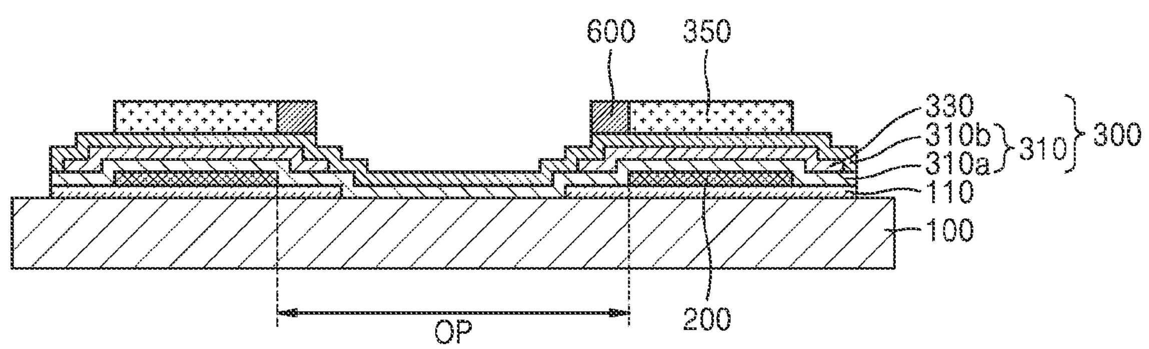

Next, referring to FIG. 6B, a buffer layer 350 may be formed over the thin film encapsulation layer 300. In this case, the upper dam 600 may reduce or prevent the buffer layer 350 from spreading or leaking to the opening portion OP.

As described above, the display unit 200 may include a light-emitting device, such as an organic light-emitting device (OLED), and the light-emitting device may include an electrode.

As an alternative embodiment, as described above, the display unit 200 may include an OLED (see FIG. 3), and the OLED (see FIG. 3) may include a first electrode 281 (see FIG. 3) and a second electrode 285 (see FIG. 3). In this case, a parasitic capacitance may occur between the touch electrode 410 (see FIG. 6C) over the display unit 200 and the first and second electrodes 281 and 285 (see FIG. 3) included in the display unit 200. When a parasitic capacitance occurs between the touch electrode 410 (see FIG. 6C) over the display unit 200 and the first and second electrodes 281 and 285 (see FIG. 3) included in the display unit 200, the sensing sensitivity thereof may be degraded.

As in the following, a parasitic capacitance Cp generated between two layers is inversely proportional to a distance "d" between the two layers. To reduce the parasitic capacitance Cp generated between the display unit 200 and the touch electrode 410 (see FIG. 6C), a certain distance is required between the display unit 200 and the touch electrode 410 (see FIG. 6C).

$$Cp \propto 1/d$$

Figure 6C:
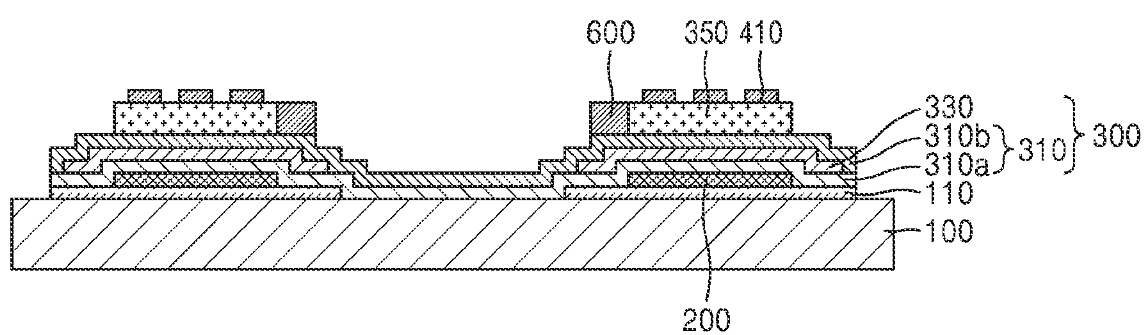

Thus, as an alternative embodiment, the buffer layer 350 may be additionally formed over the thin film encapsulation layer 300 to maintain a certain distance between the display unit 200 and the touch electrode 410 (see FIG. 6C).

In this case, the buffer layer 350 may be an organic film, as a film having a certain thickness should be formed to maintain the distance therebetween.

The buffer layer 350 may be formed to have an organic single-layer structure or a multiple-layer structure, and may be formed by various deposition processes. In some embodiments, the buffer layer 350 may be formed of at least one of polyacrylates resin, epoxy resin, phenolic resin, polyamides resin, polyimides rein, unsaturated polyesters resin, poly phenylenethers resin, poly phenylenesulfides resin, and/or benzocyclobutene (BCB).

When the buffer layer 350 is formed of an organic material, because a film may be easily formed to have a certain thickness, the distance between the display unit 200 and the touch electrode 410 (see FIG. 6C) may be maintained.

Also, when the buffer layer 350 is formed of an organic material, because the buffer layer 350 has fluidity, it may spread or flow to the opening portion OP or to the edge of the substrate 100. However, as described above, the display apparatus manufacturing method according to the present embodiment may reduce or prevent the spreading of the buffer layer 350 by forming the upper dam 600 over the thin film encapsulation layer 300.

Next, referring to FIG. 6C, a touch electrode 410 may be formed over the buffer layer 350. As described above, because the buffer layer 350 maintains the distance between the display unit 200 and the touch electrode 410, the occurrence of a touch sensing failure may be reduced or prevented.

Figure 6D:
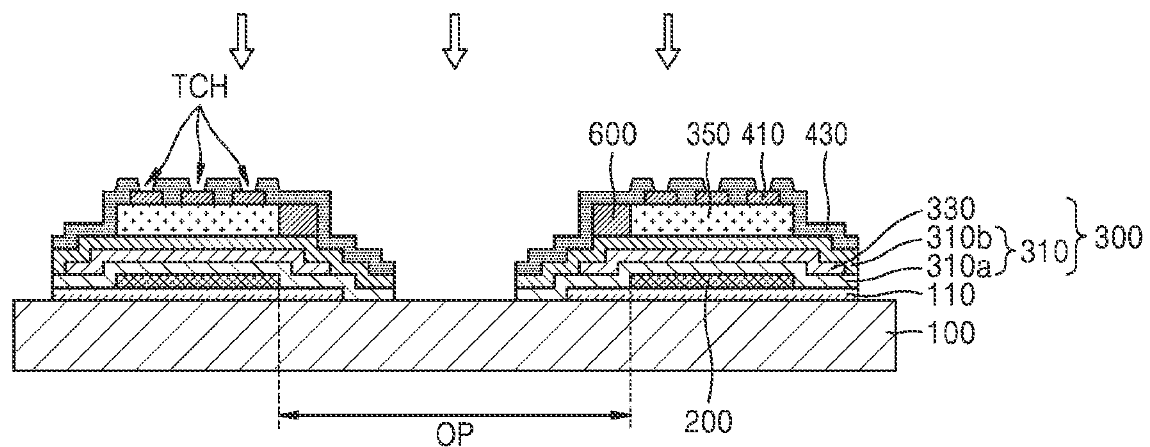

Next, referring to FIG. 6D, a touch insulating film 430 may be formed to cover the touch electrode(s) 410.

Thereafter, to expose at least a portion of the touch electrode 410, at least a portion of the touch insulating film 430 and the thin film encapsulation layer 300 in the opening portion OP may be removed together with a process of removing a portion(s) the touch insulating film 430 to form a touch contact hole(s) TCH.

When the touch insulating film 430 is an inorganic film formed of an inorganic material, a portion of the substrate 100 may be exposed by removing the touch insulating film 430 and the thin film encapsulation layer 300 in the opening portion OP concurrently with the forming of the touch contact hole(s) TCH, for example, by a dry etching process.

Figure 6E:
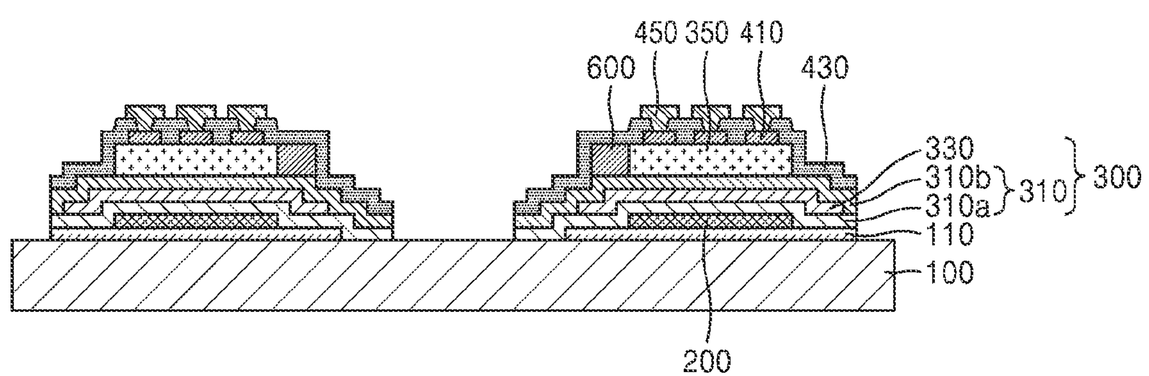

Next, referring to FIG. 6E, a touch line(s) 450 may be formed over the touch insulating film 430. The touch line(s) 450 may contact the touch electrode 410 through the touch contact hole(s) TCH.

Figure 6F:
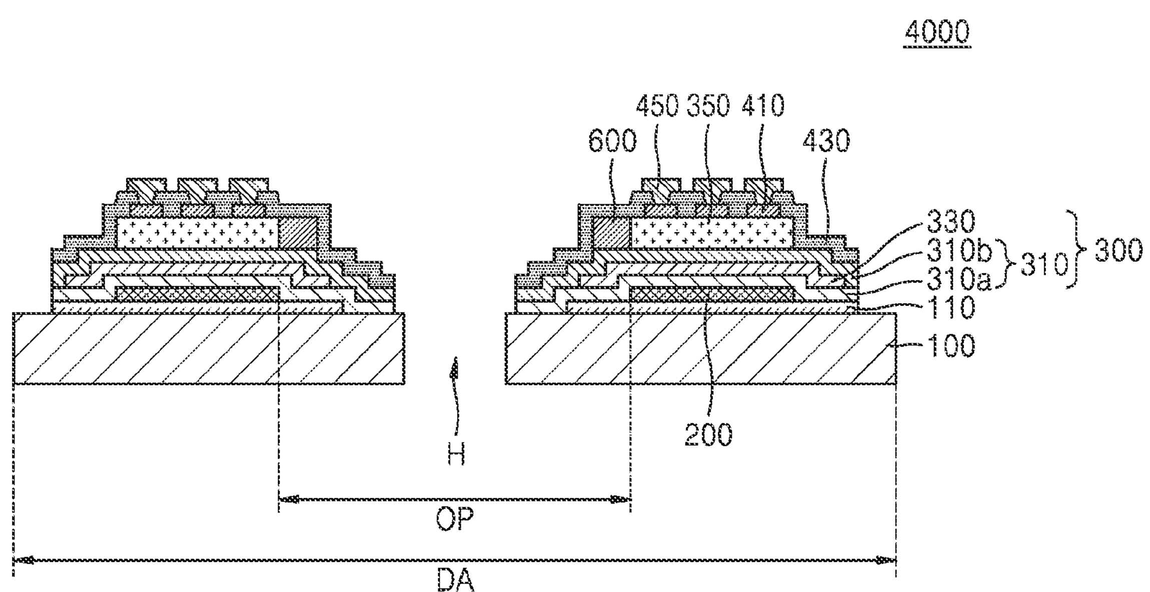

Next, referring to FIG. 6F, a hole H may be formed by removing at least a portion of the substrate 100 exposed by the removal of a portion of the touch insulating film 430 and a portion of the thin film encapsulation layer 300 in the opening portion OP.

In a display apparatus 4000 manufactured by the display apparatus manufacturing method according to the present embodiment, the hole H may be formed in the substrate 100 in the opening portion OP in the display region DA.

The hole H may be formed by physically removing at least a portion of the substrate 100. The method of forming the hole H is not limited thereto, and the hole H may be formed by various methods. In an embodiment, the hole H may have a smaller width than the opening portion OP. Also, in an embodiment, the hole H may have a smaller width than a width of the touch insulating film 430 and the thin film encapsulation layer 300 removed in the opening portion OP.

In the case of the display apparatus 4000 manufactured by the display apparatus manufacturing method according to the present embodiment, because the inorganic films arranged at a portion for formation of the hole H are removed prior to forming of the hole H in the substrate 100, the occurrence and propagation of a crack may be reduced or prevented. Also, time and cost may be saved because the touch insulating film 430 and the thin film encapsulation layer 300 in the opening portion OP may be concurrently removed in the process of the forming the touch contact hole TCH.

Also, because the upper dam 600 and the buffer layer 350 are formed to increase the distance between the touch electrode 410 and the display unit 200, the occurrence of a touch sensing failure may be reduced or prevented.

FIGS. 7A to 7G are sequential cross-sectional views illustrating a method of manufacturing a display apparatus according to another embodiment. Herein, for conciseness, differences from the display apparatus manufacturing method illustrated in FIGS. 6A to 6F will be mainly described, and like reference numerals will denote like elements, and thus redundant descriptions thereof will be omitted.

Figure 7A:
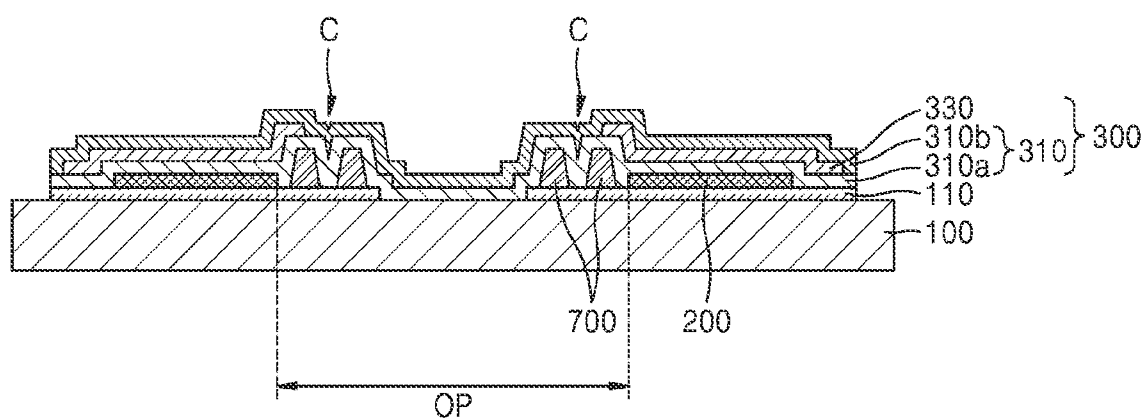
FIGS. 7A to 7G are sequential cross-sectional views illustrating a method of manufacturing a display apparatus according to another embodiment.

First, referring to FIG. 7A, a display unit 200 including an opening portion OP and a lower dam 700 may be formed over a substrate 100.

As an alternative embodiment, the lower dam 700 may be formed at an edge portion of the opening portion OP.

Although FIG. 7A illustrates the embodiment of forming two lower dams 700 at each edge portion of the opening portion OP, the number of lower dams 700 is not limited thereto. Also, the shape of the lower dam 700 is not limited, and the lower dam 700 may be formed to have any shape as long as it has a suitable height.

As an alternative embodiment, the lower dam 700 may be formed to surround an area of a hole H (see FIG. 7G) to be formed later in the substrate 100.

As an alternative embodiment, the lower dam 700 may include at least two lower dams 700 that are formed at positions spaced apart from each other by a suitable distance. For example, as illustrated in FIG. 7A, two lower dams 700 may be formed in parallel at an edge of the opening portion OP to be spaced apart from each other by a certain distance.

Next, a thin film encapsulation layer 300 may be formed to cover the lower dam 700 and the display unit 200. A concave portion C may be formed in thin film encapsulation layer 300 at a portion covering the lower dam 700. For example, as illustrated in FIG. 7A, when the thin film encapsulation layer 300 is formed to cover two lower dams 700, the thin film encapsulation layer 300 may be formed to be concavely curved between the two lower dams 700 spaced apart from each other by a certain distance. Thus, the thin film encapsulation layer 300 may include the concave portion C formed at a position between the two lower dams 700.

Figure 7B:
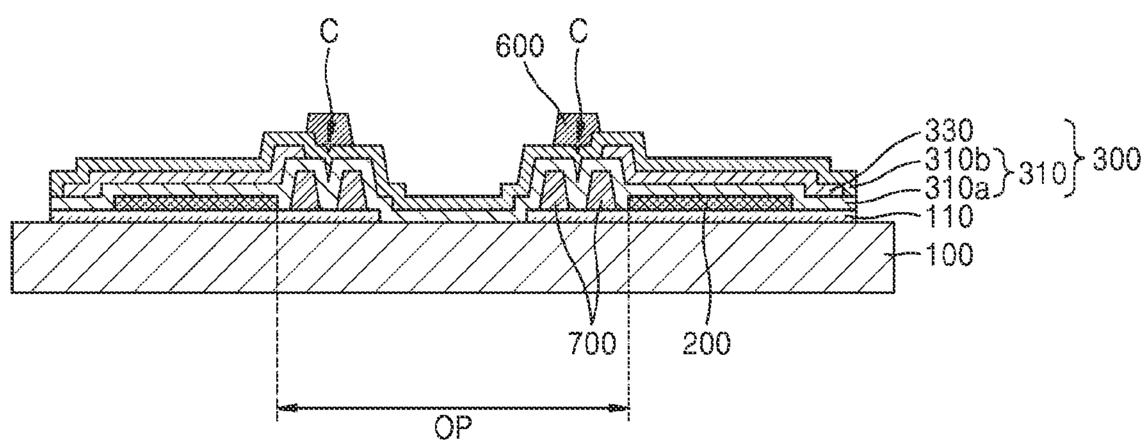

Next, referring to FIG. 7B, an upper dam 600 may be formed over the thin film encapsulation layer 300.

As described above, because the concave portion C is formed in the thin film encapsulation layer 300, the upper dam 600 may be easily formed. For example, as an alternative embodiment, two lower dams 700 spaced apart from each other may be formed, a concave portion C may be formed at a corresponding position between the two lower dams in the thin film encapsulation layer 300 covering the lower dam 700, and an upper dam 600 may be formed over the concave portion C. Because the concave portion C is formed to be curved concavely between the two lower dams 700, the upper dam 600 may be easily formed at a position of the concave portion C.

Figure 7C:
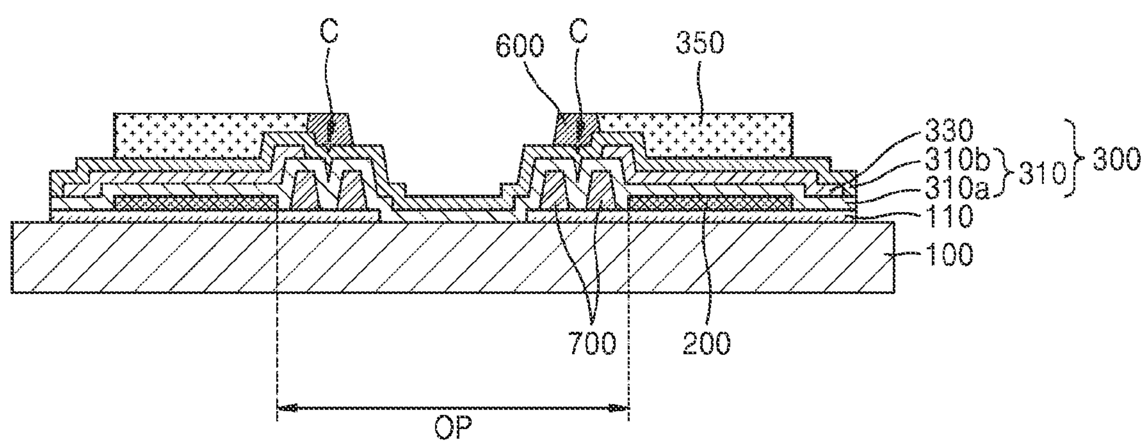

Next, referring to FIG. 7C, a buffer layer 350 may be formed over the thin film encapsulation layer 300, and the buffer layer 350 may not flow into the opening portion OP due to the upper dam 600.

Figure 7D:
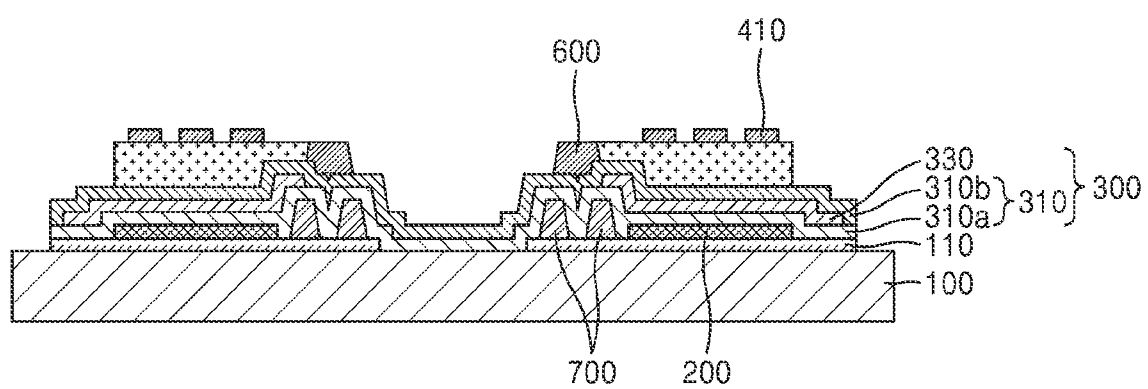

Next, referring to FIG. 7D, a touch electrode 410 may be formed over the buffer layer 350. Because the distance between the touch electrode 410 and the display unit 200 is increased by the buffer layer 350, a touch sensing failure (e.g., electrical noise) may be eliminated.

Figure 7E:
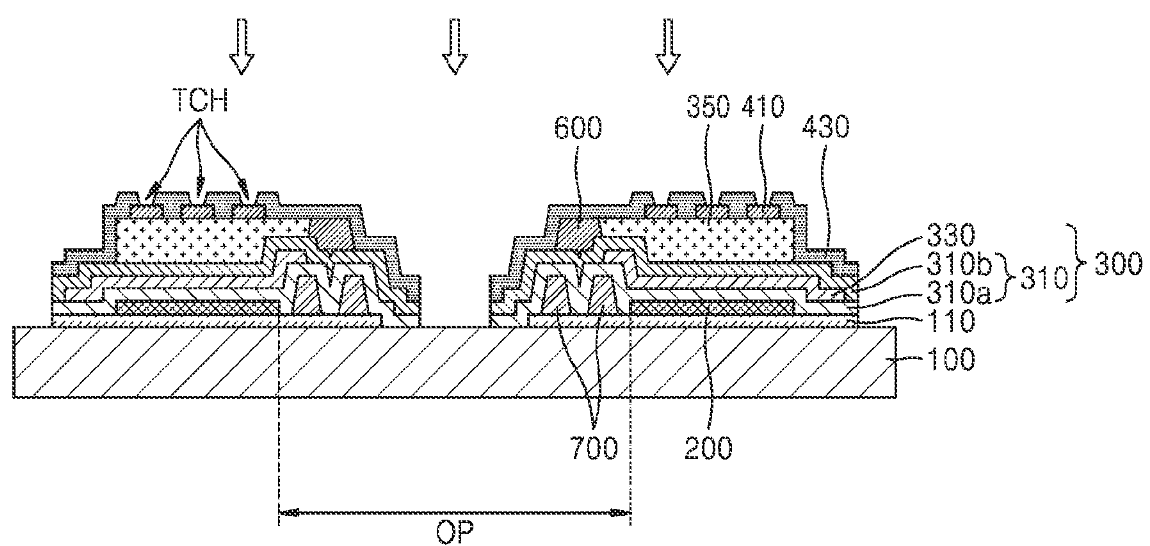

Next, referring to FIG. 7E, a touch insulating film 430 may be formed to cover the touch electrode 410, and a touch contact hole(s) TCH may be formed in the touch insulating film 430. For example, the touch contact hole(s) TCH may be formed by removing portions of the touch insulating film 430 to expose at least a portion of the touch electrode(s) 410.

In this case, at least a portion of the touch insulating film 430 and the thin film encapsulation layer 300 in the opening portion OP may be together removed to expose at least a portion of the substrate 100.

As an alternative embodiment, the thin film encapsulation layer 300 in the opening portion OP may be an inorganic film 310.

Figure 7F:
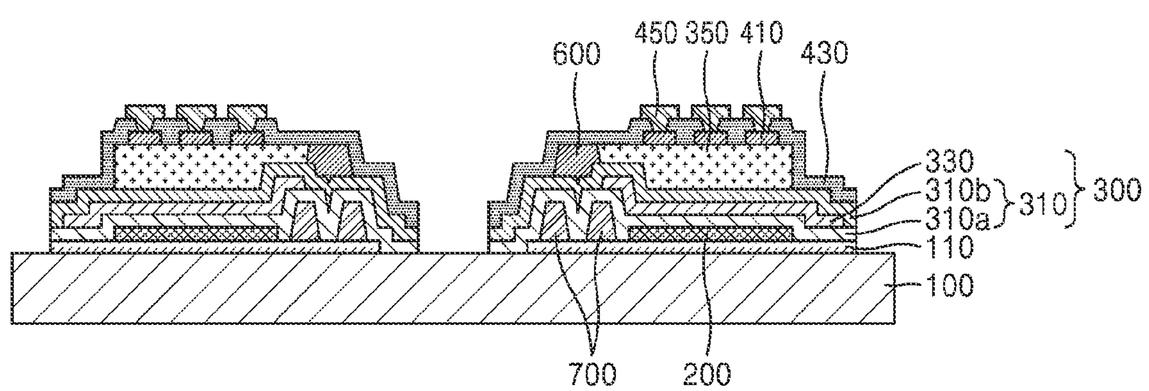

Next, referring to FIG. 7F, a touch line(s) 450 may be formed in/over the touch contact hole(s) TCH. The touch line(s) 450 may contact the touch electrode(s) 410 through the touch contact hole(s) TCH.

Figure 7G:
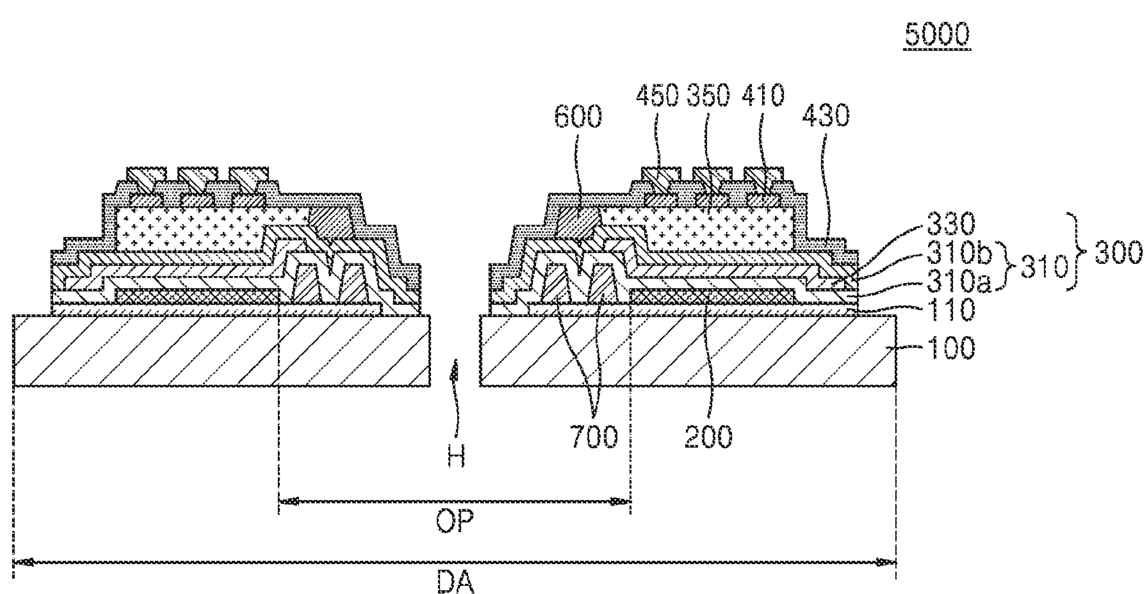

Next, referring to FIG. 7G, a hole H may be formed by removing at least a portion of the substrate 100 that is exposed by removing a portion of the touch insulating film 430 and a portion of the thin film encapsulation layer 300 in the opening portion OP.

In a display apparatus 5000 manufactured by the display apparatus manufacturing method according to the present embodiment, the hole H may be formed in the substrate 100 in the opening portion OP in the display region DA.

The hole H may be formed by physically removing at least a portion of the substrate 100. The method of forming the hole H is not limited thereto, and the hole H may be formed by various methods. The hole H may have a smaller width than the opening portion OP, and/or may have a smaller width than the portions of the touch insulating film 430 and the thin film encapsulation layer 300 removed from the opening portion OP.

In the case of the display apparatus 4000 manufactured by the display apparatus manufacturing method according to the present embodiment, because the inorganic films, which are arranged at a portion for formation of the hole H, are removed in advance before the forming of the hole H in the substrate 100, the occurrence and propagation of a crack may be reduced or prevented. Also, time and cost may be saved because the touch insulating film 430 and the thin film encapsulation layer 300 in the opening portion OP may be concurrently removed during the process of the forming the touch contact hole TCH.

Also, because the upper dam 600 and the buffer layer 350 are formed to increase the distance between the touch electrode 410 and the display unit 200, the occurrence of a touch sensing failure may be reduced or prevented.

Also, the upper dam 600 may be easily formed because the lower dam 700 is formed over the substrate 100 and the concave portion C is formed to be downwardly concaved and curved by the lower dam 700 in the thin film encapsulation layer 300 covering the lower dam 700.

As described above, according to one or more of the above embodiments, it may be possible to reduce or prevent a crack from propagating or occurring in the inorganic film in the case of forming the hole in the substrate in the display region.

Also, because the inorganic film of a portion where the hole will be formed in the progress of a touch process is removed in advance, the hole may be formed in the substrate without cracking, and while reducing the number of processes.

While the embodiments of the inventive concept have been illustrated and described above with reference to the figures, those of ordinary skill in the art will understand that the inventive concept is not limited to the above embodiments, and that various changes and modifications in form and details may be made therein without departing from the spirit and scope of the inventive concept as defined by the appended claims and their functional equivalents.

It should be understood that embodiments described herein should be considered in a descriptive sense only and not for purposes of limitation. Descriptions of features or aspects within each embodiment should typically be considered as available for other similar features or aspects in other embodiments.

What is claimed is:

1. A display apparatus, comprising:

a substrate having a hole;

a pixel array over the substrate, the pixel array comprising a plurality of pixels that are arranged around the hole;

an encapsulation layer over the pixel array and comprising a first inorganic film, an organic film, and a second inorganic film, wherein the organic film is interposed between the first inorganic film and the second inorganic film;

a touch layer over the encapsulation layer, the touch layer comprising a touch insulating film and a plurality of touch electrodes; and a passivation layer including organic material and located over the touch layer, wherein the passivation layer overlaps at least a part of the touch insulating film in a region between the pixel array and the hole.

2. The display apparatus of claim 1, wherein the organic material of the passivation layer comprises polyethylene terephthalate, polyimide, polycarbonate, epoxy, polyethylene, or polyacrylate.

3. The display apparatus of claim 1, wherein an upper surface of the passivation layer is substantially flat.

4. The display apparatus of claim 1, wherein a portion of the passivation layer overlaps a portion of the organic film.

5. The display apparatus of claim 1, wherein the passivation layer, the touch insulating film, the second inorganic film, and the first inorganic film overlap each other in the region between the pixel array and the hole.

6. The display apparatus of claim 5, wherein the second inorganic film and the first inorganic film are directly in contact with each other in the region around the hole.

7. The display apparatus of claim 1, wherein the plurality of pixels includes two pixels that are spaced from each other with the hole therebetween, and wherein a width of the hole is less than a distance between the two pixels.

8. A display apparatus comprising:

a substrate having a hole;

a pixel array over the substrate, the pixel array comprising a plurality of pixels that are arranged around the hole;

an encapsulation layer over the pixel array and comprising a first inorganic film, an organic film, and a second inorganic film, wherein the organic film is interposed between the first inorganic film and the second inorganic film;

a touch layer over the encapsulation layer, the touch layer comprising a touch insulating film and a plurality of touch electrodes, wherein an edge of the touch insulating film extends towards the hole and beyond an edge of the organic film; and a passivation layer including organic material and located over the touch layer, wherein the passivation layer overlaps the first inorganic film and the second inorganic film in a region between the hole and the pixel array.

9. The display apparatus of claim 8, wherein the organic material of the passivation layer comprises polyethylene terephthalate, polyimide, polycarbonate, epoxy, polyethylene, or polyacrylate.

10. The display apparatus of claim 8, wherein an upper surface of the passivation layer is substantially flat.

11. The display apparatus of claim 8, wherein the passivation layer overlaps a portion of the organic film.

12. The display apparatus of claim 8, wherein the second inorganic film is directly in contact with the first inorganic film in the region between the hole and the pixel array.

13. The display apparatus of claim 8, wherein a portion of the passivation layer is directly in contact with an upper surface of the touch insulating film in the region between the hole and the pixel array.

14. The display apparatus of claim 8, wherein the plurality of pixels includes two pixels that are spaced from each other with the hole therebetween, and wherein a width of the hole is less than a distance between the two pixels.

* * * * *